United States Patent
Inui (10) Patent No.: US 6,930,912 B2
(45) Date of Patent: Aug. 16, 2005

(54) MAGNETIC MEMORY AND DRIVING METHOD THEREFOR

(75) Inventor: Fumihiro Inui, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/677,311

(22) Filed: Oct. 3, 2003

(65) Prior Publication Data

US 2004/0170052 A1 Sep. 2, 2004

Related U.S. Application Data

(63) Continuation of application No. 10/112,748, filed on Apr. 2, 2002, now Pat. No. 6,700,813.

(30) Foreign Application Priority Data

Apr. 3, 2001 (JP) ........................................ 2001-104457

(51) Int. Cl.[7] ............................................... G11C 11/00
(52) U.S. Cl. ........................ 365/158; 365/100; 365/171
(58) Field of Search ................................. 365/100, 130, 365/158, 171, 173

(56) References Cited

U.S. PATENT DOCUMENTS

| | | | |
|---|---|---|---|
| 5,640,343 A | 6/1997 | Gallagher et al. | 365/171 |
| 5,699,293 A | 12/1997 | Tehrani et al. | 365/158 |
| 5,831,920 A | 11/1998 | Chen et al. | 365/225.5 |
| 6,055,178 A | 4/2000 | Naji | 365/158 |
| 6,504,752 B2 | 1/2003 | Ito | 365/158 |
| 6,587,370 B2 * | 7/2003 | Hirai | 365/171 |
| 6,614,682 B2 * | 9/2003 | Hirai | 365/173 |

OTHER PUBLICATIONS

Magneto–Resistive IC Memory Limitations and Architecture Implications, Roy E. Scheu riein (pp. 47 to 50), 1998 Int'l. Nonvolatile Memory Technology Conference.

Spin–Valve–Like Ferromagnetic Tunnel Junction, Kazuo Kobayashi, et al. (pp. 11 to 17) (with English translation), Nov. 5, 1999.

* cited by examiner

Primary Examiner—Son L. Mai
(74) Attorney, Agent, or Firm—Fitzpatrick, Cella, Harper & Scinto (57) ABSTRACT

A magnetic memory includes a plurality of variable resistors arrayed as memory elements in a matrix, a plurality of bit lines each of which is arranged on each row of the matrix and connected to one terminal of each variable resistor belonging to the same row, a read circuit which detects the resistance values of the variable resistors based on currents flowing through the bit lines, and load elements connected to the bit lines independently of and in parallel with the memory elements.

2 Claims, 8 Drawing Sheets

MAGNETIC MEMORY AND DRIVING METHOD THEREFOR

The present application is a continuation application of application Ser. No. 10/112,748 filed Apr. 2, 2002 now U.S. Pat. No. 6,700,813, the entire contents of which is incorporated herein by reference.

BACKGROUND OF THE INVENTION

1. Field of the Invention

The present invention relates to a magnetic memory for storing information and a driving method therefor and, more particularly, to a nonvolatile memory using a ferromagnet and a driving method therefor.

2. Related Background Art

In general, a ferromagnet has a property that magnetization generated within the ferromagnet by an externally applied magnetic field remains even after removal of the external magnetic field (this is called residual magnetization). The resistance of the ferromagnet changes depending on the magnetization direction, the presence/absence of magnetization, or the like. This is called a magnetoresistance effect. The change ratio of the resistance is called a MR ratio (MagnetoResistance ratio). Materials having high MR ratios are a GMR (Giant MagnetoResistance) material and a CMR (Colossal MagnetoResistance) material. These materials consist of metals, alloys, composite oxides, and the like. Examples of these materials are transition metals and rare earth metals such as Fe, Ni, Co, Gd, and Tb, alloys of them, and composite oxides such as $La_xSr_{1-x}MnO_9$ and $La_xCa_{1-x}MnO_9$. A nonvolatile memory for storing information by selecting the resistance depending on the difference in magnetization direction or the presence/absence of magnetization by utilizing the residual magnetization of such a magnetoresistance material can be constituted. This nonvolatile memory is called an MRAM (Magnetic Random Access Memory).

Most of MRAMs which have recently been developed adopt the following method. That is, ferromagnetic memory cells for storing information by residual magnetization of the ferromagnet of a giant magnetoresistance material are formed. A change in resistance by the difference in magnetization direction is converted into a voltage to read out stored information. In addition, the magnetization direction of a ferromagnetic memory cell is changed by a magnetic field induced by flowing a current through a write wire, and information can be written in the memory cell or rewritten.

The cell structure and driving method of an MRAM are described in R. E. Scheuerlein (1998, Proc. of Int NonVolatile Memory Conf. p. 47).

This reference proposes an MRAM in which a pair of write lines and a pair of read lines are laid out to cross each other, and an MRAM (matrix type) in which a pair of crossing wires serve as both write and read lines and which is made up of memory cells each containing a giant magnetoresistive thin film and diodes series-connected to the memory cells.

These conventional MRAMs employ the following driving method. In reading out information from memory cells arrayed in a matrix, a bit line connected to a target memory cell is charged to a voltage level (to be referred to as a target voltage Vt hereinafter) suitable for read operation. The target voltage Vt is applied across a variable resistor which constitutes the memory cell, thereby extracting a signal current flowing through the variable resistor.

The bias voltage (target voltage Vt) dependency of the MR ratio reported in the materials (p. 15, FIG. 8) of the 117th Symposium (2000/12/22) of the Magnetics Society of Japan reveals that the MR ratio has a high bias dependency. For a high bias voltage, the MR ratio is difficult to maintain. In read operation of the MRAM, it is important to supply a target voltage Vt of about 100 to 300 mV with high precision.

Figure 10:
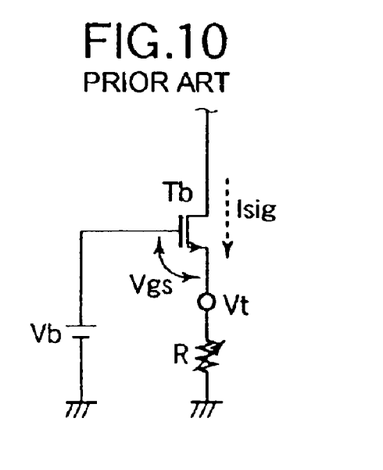
FIG. 10 is a circuit diagram for explaining read operation of a conventional MRAM.

FIG. 10 is a circuit diagram for explaining read operation of a conventional MRAM. No selection switch is illustrated in FIG. 10 on the assumption that a memory cell subjected to read operation has already been selected.

Referring to FIG. 10, only a variable resistor R and a field effect type transistor Tb for supplying the target voltage Vt are illustrated. In FIG. 10, the gate terminal of the field effect type transistor Tb receives a bias voltage Vb, and a source terminal voltage, i.e., target voltage Vt (=Vb−Vgs) is applied in accordance with a gate-source voltage Vgs.

A signal current Isig flows through the variable resistor R in accordance with the target voltage Vt, and is transferred with a gain of 1 from the source terminal to drain terminal of the field effect type transistor Tb. More specifically, as shown in the signal current Isig—target voltage Vt characteristic of FIG. 11, the target voltage Vt is determined as a voltage value at an intersection point 113 between an I–V characteristic curve 111 of the variable resistor R and an I–V characteristic curve 112 of the field effect type transistor Tb.

Figure 11:
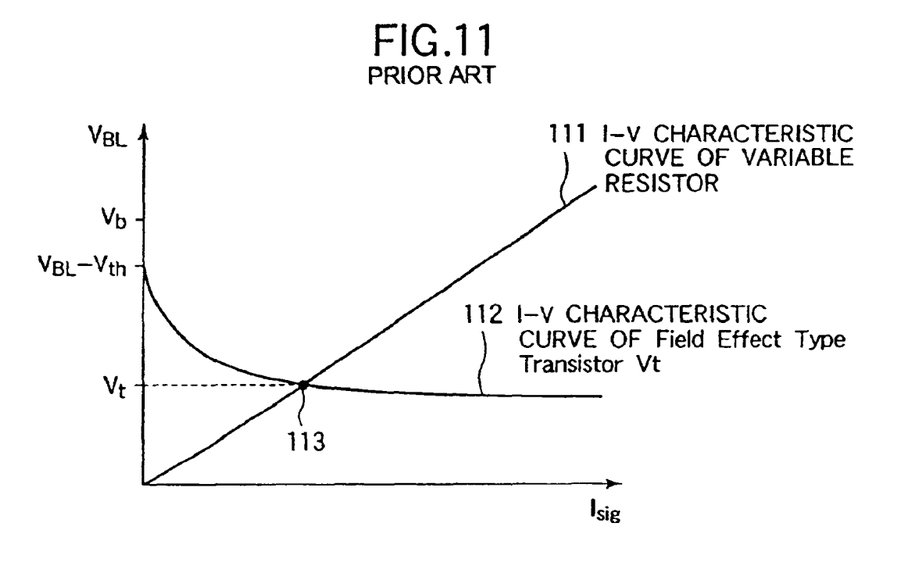
FIG. 11 is a graph showing a signal current Isig—target voltage Vt characteristic for explaining a target voltage Vt in the circuit diagram shown in FIG. 10.

As is apparent from the graph of FIG. 11, the target voltage Vt cannot be maintained at a predetermined voltage upon large variations in the burden of the variable resistor R connected as the load of the field effect type transistor Tb. In particular, the burden of a bit line in an indefinite state in which no connected memory cell is selected is greatly different from the burden exhibited when a memory cell is selected. Thus, the voltage level of the bit line is very different from the target voltage Vt.

Figure 12:
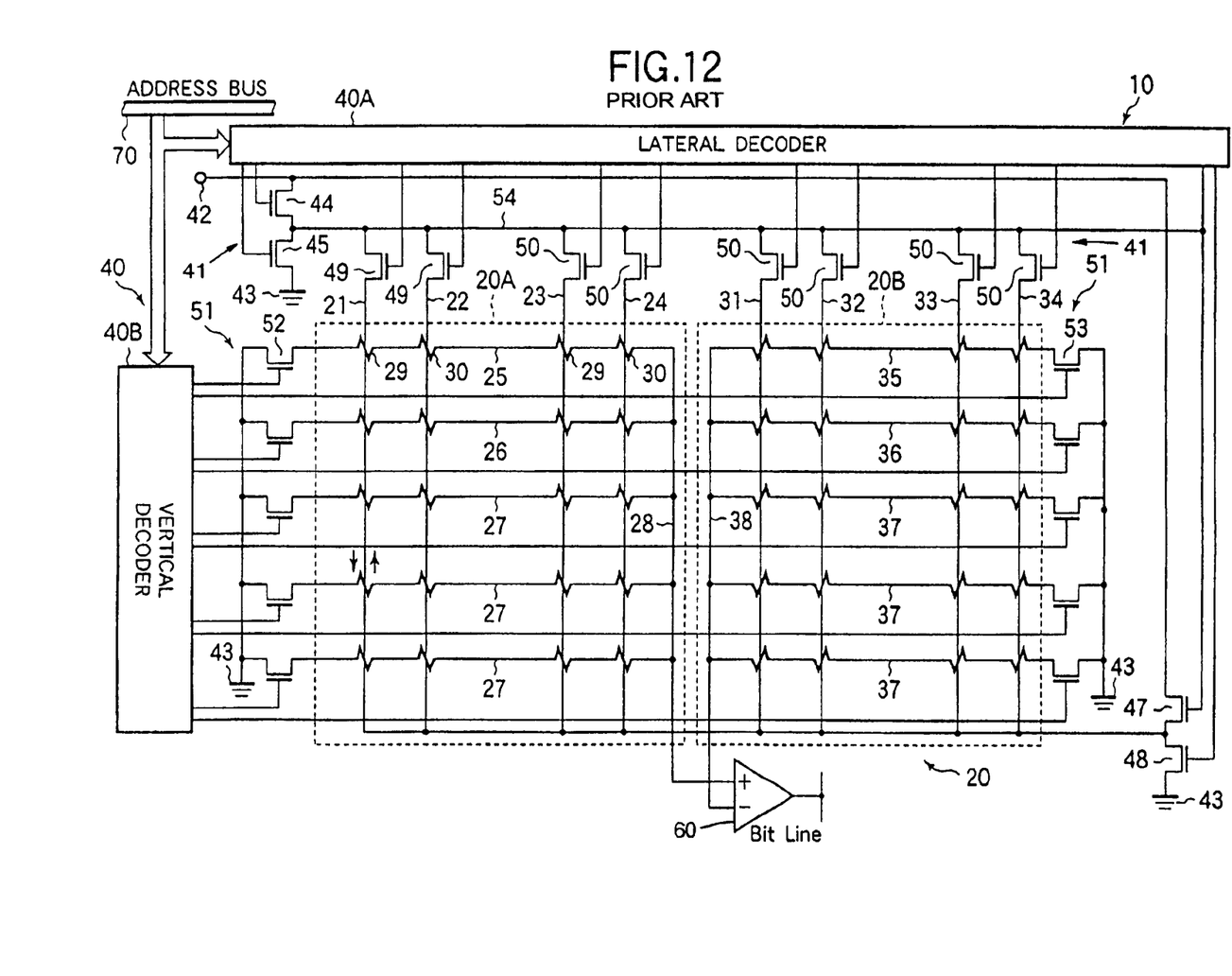
FIG. 12 is a circuit diagram schematically showing a conventional magnetic memory circuit having a memory array 20 in which a plurality of memory cells are arrayed at the intersections of word lines and sense lines.

FIG. 12 shows the circuit arrangement of a magnetic memory as an example of a conventional magnetic memory. FIG. 12 is a circuit diagram briefly showing a conventional magnetic memory circuit 10 having a memory array 20 in which a plurality of memory cells are arrayed at the intersections of word and sense lines.

The magnetic memory circuit 10 is constituted by the memory array 20, a decoder 40, and a comparator 60. The memory array 20 is logically divided into a first array portion 20A and second array portion 20B, which are represented by dotted frames. The decoder 40 is comprised of a lateral decoder 40A and vertical decoder 40B, which are coupled to an address bus 70. Word lines 21 to 24 and 31 to 34 are coupled to the lateral decoder 40A via a lateral switching circuit 41. Sense lines 25 to 27 and 35 to 37 are coupled to the vertical decoder 40B via a vertical switching circuit 51. The word lines 21 to 24 and 31 to 34 and the sense lines 25 to 27 and 35 to 37 have intersections within the memory array 20 where memory cells are located. For example, a memory cell 29 within the first array portion 20A is located at the intersection of the word line 21 and sense line 25. By selecting the word line 21 and sense line 25, the memory cell 29 is activated. Then, a read/write process is executed. Output lines 28 and 38 for the sense lines 25 to 27 and 35 to 37 are respectively connected to the positive and negative outputs of the comparator 60. As a conventional magnetic memory read method, information (magnetization information) recorded by magnetization by selecting an arbitrary memory cell at random is read out.

Figure 13:
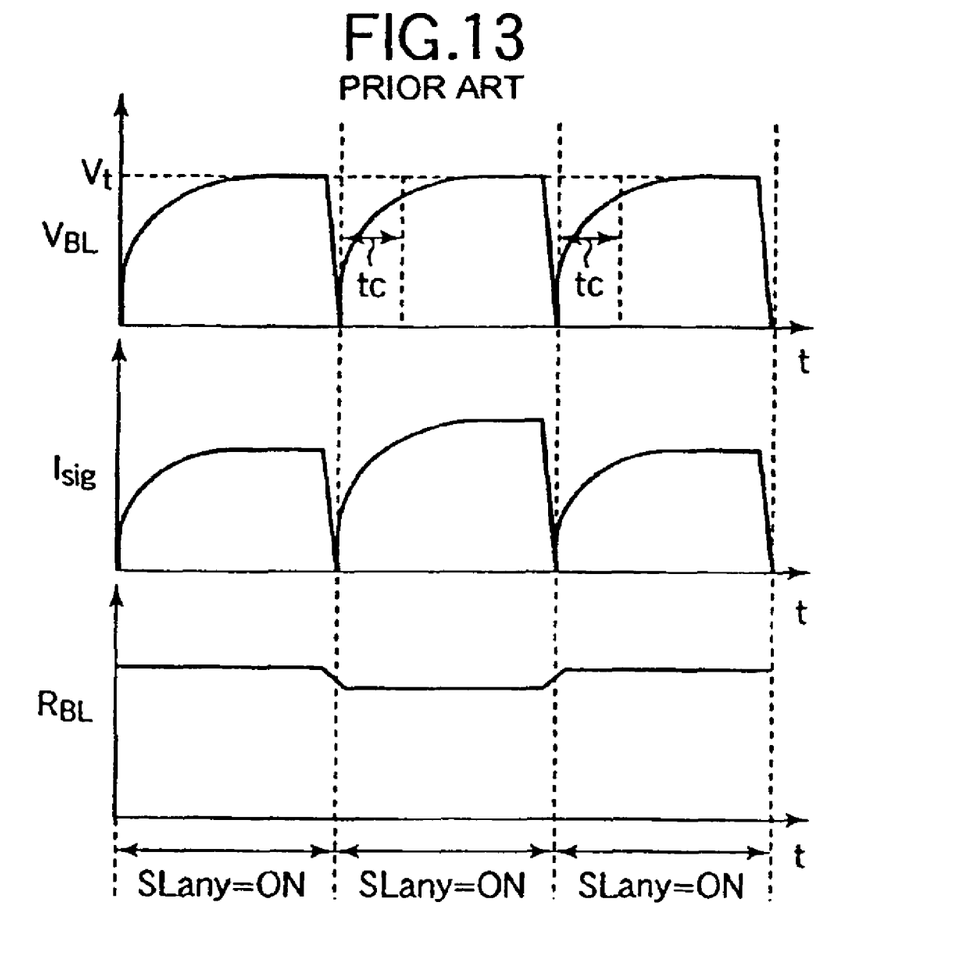
FIG. 13 is a timing chart for explaining an operation when pieces of information are successively read out from arbitrary memory cells by a conventional method.

FIG. 13 is a timing chart for explaining an operation when arbitrary memory cells are selected from a conventional magnetic memory to successively read out pieces of information. FIG. 13 shows the waveform of a voltage $V_{BL}$ of a bit line BL, that of the signal current Isig, and that of a load $R_{BL}$ viewed from the bit line when pieces of information are successively read out from arbitrary memory cells.

As shown in FIG. 13, in the conventional magnetic memory read method, an arbitrary bit line BL and memory cell are selected. Then, the voltage $V_{BL}$ of the selected bit line BL is charged up to the target voltage Vt over a time tc (charge time), and information is then read out.

In the conventional magnetic memory, every time a memory cell from which magnetization information is to be read out is selected, the bit line connected to the memory cell must be charged up to the target voltage Vt. The time taken to charge a bit line inhibits high-speed read of magnetization information.

The present invention has been made to overcome the conventional drawbacks, and has as its object to provide a magnetic memory capable of reading out information at high speed, and a driving method therefor.

SUMMARY OF THE INVENTION

To achieve the above object, the present invention discloses the following means.

(1) According to the present invention, a magnetic memory comprises a plurality of variable resistors arrayed as memory elements in a matrix, a plurality of bit lines which each of is arranged on each row of the matrix and connected to one terminal of each of variable resistors belonging to the same row, a read circuit which detects resistance values of the variable resistors based on currents flowing through the bit lines, and at least one load element arranged on the bit lines independently of the memory elements.

The respective portions are preferably designed as follows.

Each load element includes a resistor having the same structure as a structure of the variable resistor, a resistor having a structure different from the structure of the variable resistor, a current source, a diode, or a combination of the resistor, the current source, and the diode. Each variable resistor includes a magnetoresistive element.

The magnetoresistive element is magnetized mainly perpendicular to a film surface.

The magnetoresistive element is magnetized mainly parallel to a film surface.

A magnetic memory further comprises a plurality of switches which correspond to the variable resistors and select the variable resistors.

Each switch includes a field effect type transistor, a bipolar transistor, a thin film transistor, a diode, or a combination of the field effect type transistor, the bipolar transistor, the thin film transistor, and the diode.

(2) According to the present invention, a method of driving a magnetic memory which has a plurality of variable resistors arrayed in a matrix, a plurality of switches connected to the plurality of variable resistors, and a plurality of bit lines arranged on respective rows of the matrix, one terminal of each variable resistor being connected to a corresponding bit line, and the other terminal being connected to a corresponding switch, comprises the steps of suppressing variations in voltages of the bit lines, applying a predetermined voltage to the variable resistors, and detecting information written in the variable resistors based on currents flowing through the variable resistors.

The respective steps are preferably designed as follows.

In the step of suppressing variations in the voltages of the bit lines, one of the plurality of switches connected to the same bit line is always turned on.

In the step of suppressing variations in the voltages of the bit lines, one of the plurality of variable resistors connected to the same bit line is always selected.

In the step of suppressing variations in the voltages of the bit lines, a current is flowed to load elements arranged on the respective bit lines.

DETAILED DESCRIPTION OF THE PREFERRED EMBODIMENTS

The present invention provides a magnetic memory having a plurality of variable resistors, and a driving method therefor. In the present specification, a ferromagnetic memory will be exemplified as the memory having a plurality of variable resistors. The variable resistor used in the present invention can select a resistance value by selecting the magnetization direction of a ferromagnet.

The magnetoresistive element of this variable resistor is a tunneling magnetoresistive element (MTJ; Magnetic Tunnel Junction, TMR; Tunneling MagnetoResistive element) having a structure in which a tunneling insulating film is sandwiched between two ferromagnetic layers. This element has recently received attention because it can increase the magnetoresistance ratio.

A variable resistor having two ferromagnetic layers, like a TMR element, exhibits a low resistance value when the magnetization direction of one ferromagnetic layer coincides with that of the other ferromagnetic layer (to be referred to as "parallel" hereinafter). The variable resistor exhibits a high resistance value when the magnetization directions of the two layers are opposite to each other (to be referred to as "antiparallel" hereinafter). The TMR element can record and maintain information (magnetization information) expressing two states by the difference in magnetization direction.

This type of variable resistor can be utilized as the memory cell of a nonvolatile memory.

In a ferromagnetic memory as a nonvolatile memory using a variable resistor, memory cells are arrayed in a matrix on a substrate. In the ferromagnetic memory, parallel or antiparallel magnetization information is recorded (written) in a ferromagnet functioning as a recording layer in a memory cell at an arbitrary position. For this purpose, a plurality of crossing wires are laid out so as to pass through the vicinity of variable resistors. A write current flows through a pair of crossing wires (write and bit lines) to induce a magnetic field which intensifies near the intersection. Magnetization information is written in a corresponding variable resistor.

In reading out written magnetization information from a ferromagnetic memory, a memory cell is selected from memory cells arrayed on a substrate, and whether the magnetization state of the variable resistor of the memory cell is parallel or antiparallel must be output (read out).

For this purpose, e.g., bit lines run in the row direction of the matrix in the ferromagnetic memory. One terminal of each of the variable resistors of memory cells belonging to one row are connected to a bit line on this row. Further, a selection switch is disposed between the other terminal of the variable resistor and ground.

The bit lines and selection switches are controlled, and the target voltage Vt is applied across each variable resistor to flow a current through the variable resistor. From the resistance value, whether the state of the variable resistor is parallel or antiparallel is read out as magnetization information.

Preferred embodiments of the present invention will be described in detail with reference to the accompanying drawings.

Figure 1:
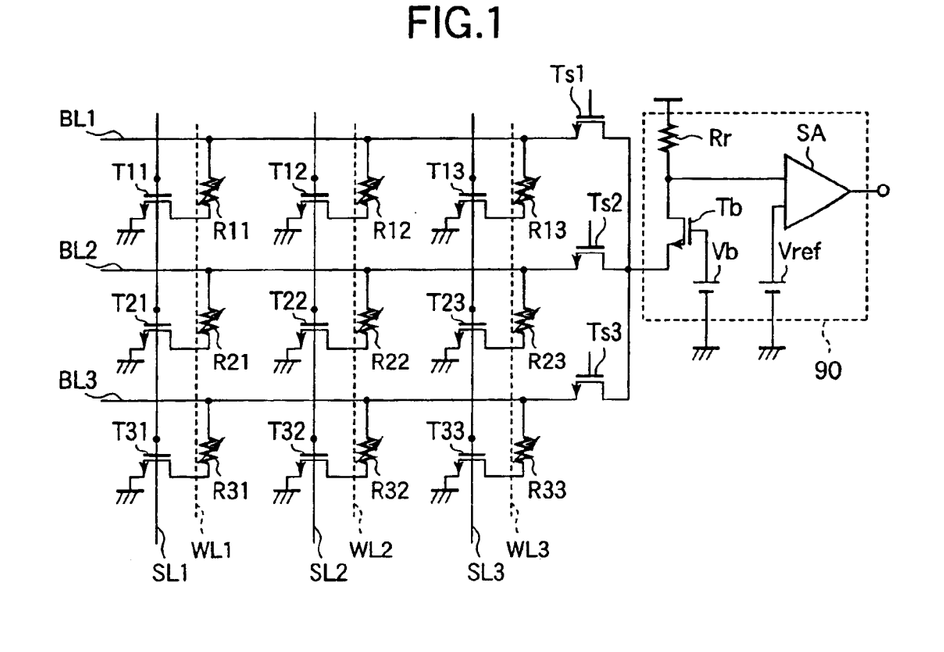
FIG. 1 is a circuit diagram showing the arrangement of a ferromagnetic memory according to the first embodiment of the present invention.

FIG. 1 is a circuit diagram showing the arrangement of a ferromagnetic memory according to the first embodiment of the present invention.

In FIG. 1, field effect type transistors (FET) T11, T12, T13, T21, T22, T23, T31, T32, and T33 serve as switches. TMR elements R11, R12, R13, R21, R22, R23, R31, R32, and R33 serve as variable resistors. The ferromagnetic memory has write lines WL1, WL2, and WL3, bit lines BL1, BL2, and BL3, and memory cell selection lines SL1, SL2, and SL3. Field effect type transistors Ts1, Ts2, and Ts3 function as switching elements. A read circuit 90 comprises a load resistor Rr, a field effect type transistor Tb, voltage sources Vb and Vref, and a sense amplifier SA.

The bit lines BL1, BL2, and BL3 preferably run parallel to each other. The write lines WL1, WL2, and WL3 also preferably run parallel to each other. The bit lines BL1, BL2, and BL3 and the write lines WL1, WL2, and WL3 cross each other. The memory cell selection lines SL1, SL2, and SL3 and the write lines run parallel to each other. The memory cell selection lines SL1, SL2, and SL3 run parallel to each other and to the write lines WL1, WL2, and WL3.

The field effect type transistors T11, T12, T13, T21, T22, T23, T31, T32, and T33 are paired with the corresponding TMR elements R11, R12, R13, R21, R22, R23, R31, R32, and R33 to constitute memory cells. The nine memory cells are arrayed in a 3×3 matrix at the intersections of the bit lines BL1, BL2, and BL3, the write lines WL1, WL2, and WL3, and the memory cell selection lines.

The drain of each of the field effect type transistors T11, T12, T13, T21, T22, T23, T31, T32, and T33 is connected to one terminal of each of the paired TMR elements R11, R12, R13, R21, R22, R23, R31, R32, and R33. The source of each of the field effect type transistors T11, T12, T13, T21, T22, T23, T31, T32, and T33 is grounded. The other terminal of each of the TMR elements R11, R12, and R13 is connected to the bit line BL1. Similarly, the other terminal of each of the TMR elements R21, R22, and R23 is connected to the bit line BL2. The other terminal of each of the TMR elements R31, R32, and R33 is connected to the bit line BL3. The gates of the field effect type transistors T11, T21, and T31 are connected to the memory cell selection line SL1. Similarly, the gates of the field effect type transistors T12, T22, and T32 are connected to the memory cell selection line SL2. The gates of the field effect type transistors T13, T23, and T33 are connected to the memory cell selection line SL3.

The bit line BL1 is connected to the source of the field effect type transistor Ts1; the bit line BL2, to that of the field effect type transistor Ts2; and the bit line BL3, to that of the field effect type transistor Ts3.

The drains of the field effect type transistors Ts1, Ts2, and Ts3 connected to the respective bit lines are commonly connected to the source of the field effect type transistor Tb. One terminal of the load resistor Rr is pulled up to the power supply voltage, and its other terminal is connected to the drain of the field effect type transistor Tb and one input terminal of the sense amplifier SA. The gate of the field effect type transistor Tb receives a voltage from the voltage source Vb. The other input terminal of the sense amplifier SA receives a voltage from the voltage source Vref.

The field effect type transistors T11, T21, and T31 are switches for selecting the corresponding TMR elements R11, R21, and R31. If the memory cell selection line SL1 is selected, the field effect type transistors T11, T21, and T31 are turned on to ground one terminal of each of the TMR elements R11, R21, and R31.

Similarly, if the memory cell selection line SL2 is selected, one terminal of each of the TMR elements R12, R22, and R32 is grounded. If the memory cell selection line SL3 is selected, one terminal of each of the TMR elements R13, R23, and R33 is grounded.

When the field effect type transistors Ts1, Ts2, and Ts3 are selected, they supply the target voltage Vt to the bit lines BL1, BL2, and BL3.

For example, to select the TMR element R11, the field effect type transistor Ts1 and field effect type transistor T11 are turned on to supply the target voltage Vt to the bit line BL1. A voltage almost equal to the target voltage Vt is applied across the TMR element R11, and a signal current corresponding to the resistance value of the TMR element R11 is output to the read circuit 90.

The field effect type transistor Tb constitutes a gate ground circuit using a TMR element as a load. The field effect type transistor Tb supplies a voltage (target voltage Vt) corresponding to the bias voltage Vb to a bit line, and outputs the obtained signal current from the drain to the load resistor Rr.

The load resistor Rr converts a signal current input from the drain of the field effect type transistor Tb into a voltage.

The sense amplifier SA compares the input voltage levels of the two input terminals, and outputs information "1" or "0" on the basis of the comparison result. In the first embodiment, a signal voltage read out using the load resistor Rr is compared with the reference voltage Vref.

Information is written in the ferromagnetic memory of the first embodiment by flowing currents to both a desired bit line and write line. Information is read out from the ferromagnetic memory of the first embodiment by turning on the field effect type transistor (e.g., Ts1 or Ts2) of a bit line to be selected, and comparing a readout signal voltage with the reference voltage Vref by the sense amplifier SA. At this time, the reference voltage may be a predetermined voltage supplied from the voltage source, as shown in FIG. 1, a voltage generated by a reference voltage generation dummy cell, or a voltage obtained by reversing the state of a cell subjected to read operation.

Figure 2A:
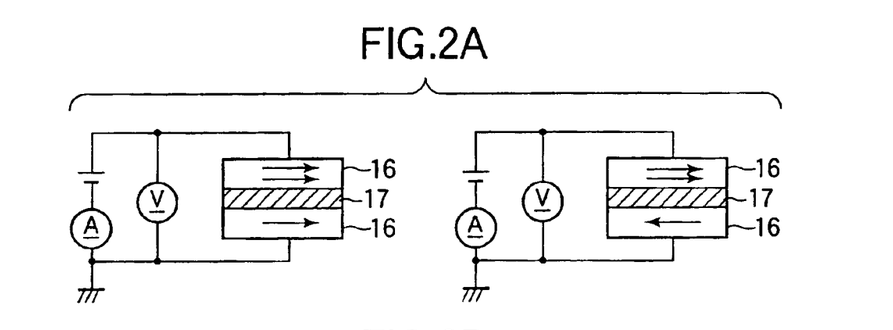
FIGS. 2A and 2B are schematic views showing the structure of a variable resistor adopted in the present invention.
Figure 2B:
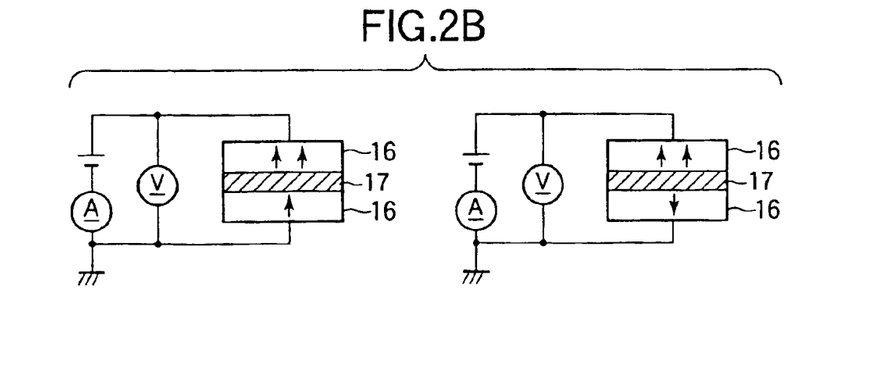

FIGS. 2A and 2B are schematic views showing the structure of a variable resistor adopted in the present invention.

Figure 3:
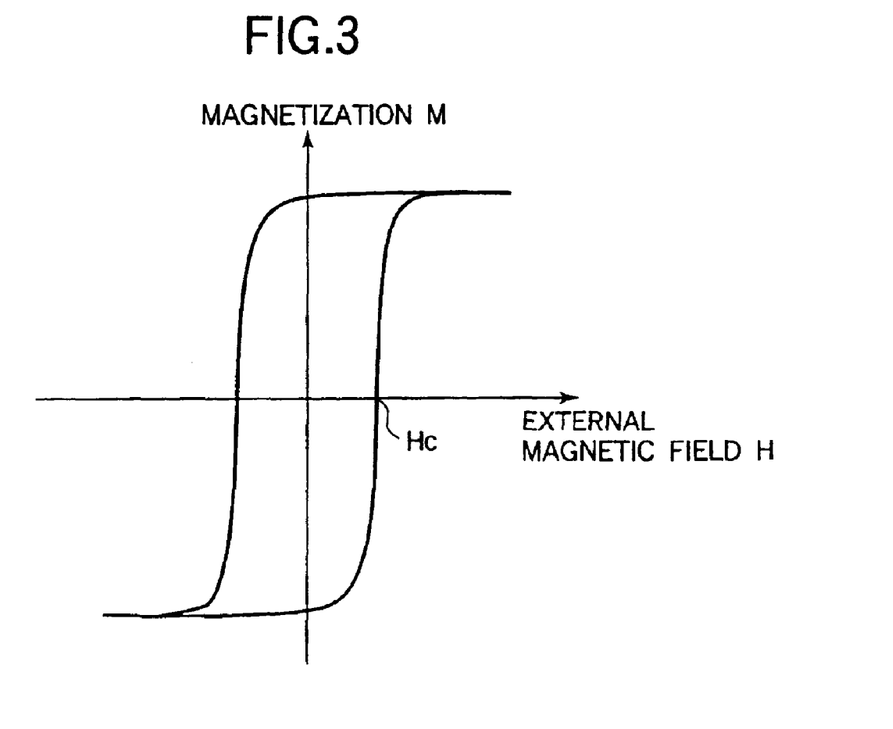
FIG. 3 is a graph showing the magnetization characteristic of a magnetic substance.

FIG. 3 is a graph showing the magnetization characteristic of the magnetic substance, i.e., showing the relationship between an external magnetic field H and magnetization M.

In FIGS. 2A and 2B, the TMR element is made up of ferromagnetic layers 16 and a tunneling insulating film 17.

In general, a ferromagnet internally generates polarization (magnetization) M upon application of the external magnetic field H in a direction in which magnetization easily occurs (easy axis of magnetization). The relationship between the magnetization M and the external magnetic field H draws a hysteresis curve, as shown in FIG. 3. An external magnetic field at a boundary where the magnetization is switched, i.e., an external magnetic field where the M-H curve crosses the H axis is called a coercive force Hc.

The ferromagnet has a property that the coercive force Hc becomes smaller upon application of both an external magnetic field along the easy axis of magnetization and an external magnetic field in a direction different from the easy axis of magnetic field than upon application of a single external magnetic field along the easy axis of magnetization. In this case, the magnetization of the ferromagnet is switched by an external magnetic field weaker than the original coercive force Hc.

As shown in FIGS. 2A and 2B, the TMR element has the two ferromagnetic layers 16 serving as a large-coercive-force hard layer and small-coercive-force soft layer, and the tunneling insulating film 17. In the TMR element, the tunneling insulating film 17 is sandwiched between the two ferromagnetic layers 16. The TMR element exhibits a different resistance value depending on whether the magnetization directions of the hard and soft layers are the same direction (parallel) or opposite directions (antiparallel). This phenomenon is a so-called magnetoresistance effect. The variation width of the resistance value is 40% or more at maximum.

FIG. 2A shows a TMR element in which the ferromagnetic layer is magnetized parallel to the film surface (longitudinal magnetization type). FIG. 2B shows a TMR element in which the ferromagnetic layer is magnetized perpendicular to the film surface (perpendicular magnetization type). In either case, the magnetization of the ferromagnetic layer is switched by a magnetic field induced by a current flowing through a wire.

A TMR element whose magnetization is to be switched receives an external magnetic field along the easy axis of magnetization that is induced by a current flowing through a write line, and an external magnetic field in a direction different from the easy axis of magnetization that is induced by a current flowing through a bit line.

In many cases, the ferromagnetic layers 16 functioning as the hard and soft layers of the TMR element are made of, e.g., a metal material or alloy. The tunneling insulating film 17 is made of an oxide insulating material such as $Al_2O_3$.

The resistance value of the TMR element is high when the magnetizations of the hard and soft layers are antiparallel, and low when they are parallel to each other.

Figure 4:
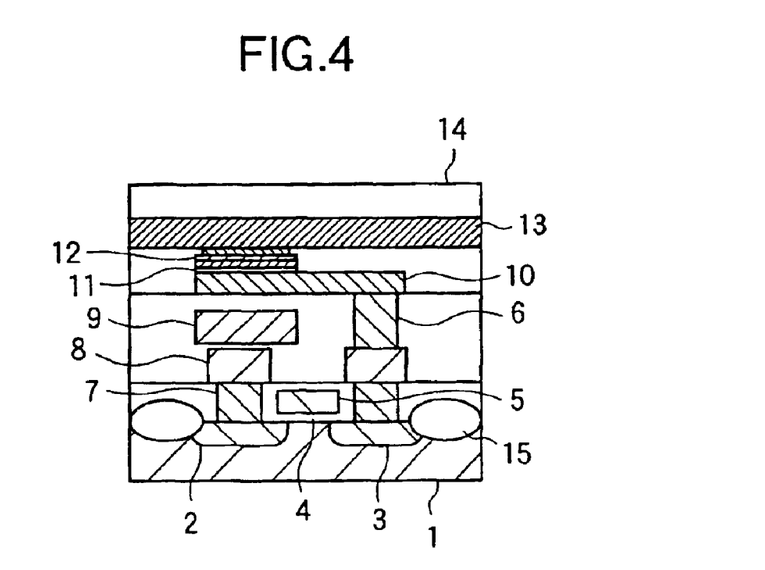
FIG. 4 is a schematic sectional view showing a longitudinal magnetization memory cell as a cell structure of a memory element in the present invention.

FIG. 4 is a schematic sectional view showing a longitudinal magnetization memory cell as a cell structure of a memory element in the present invention.

The longitudinal magnetization memory cell shown in FIG. 4 is constituted by a p-type semiconductor substrate 1, n-type diffusion regions 2 and 3, a gate insulating film 4, a gate electrode 5, contact plugs 6 and 7, a ground wire 8, a write line 9, a local wire 10, a lower electrode 11, a TMR element 12, a bit line 13, and a protective insulating film 14.

A field effect type transistor made up of the n-type diffusion region 3, gate insulating film 4, and gate electrode 5 is formed on the p-type semiconductor substrate 1, similar to the n-type diffusion region 2. A region isolation area 15 isolates the field effect type transistor from an adjacent element.

One terminal of the TMR element 12 serving as a variable resistor capable of selecting a resistance value by selecting the magnetization direction of a ferromagnet is connected to the n-type diffusion region 3 via the local wire 10 and contact plug 6. The other terminal of the TMR element 12 is coupled to the bit line 13.

The n-type diffusion region 2 is connected to the ground wire 8 via the contact plug 7.

The write line 9 crosses the bit line 13.

In write operation, currents flow through the write line 9 and bit line 13, and an external magnetic field induced by the currents changes the magnetization direction of the ferromagnet of the TMR element 12.

As shown in FIG. 4, in the longitudinal magnetization memory cell, the write line 9 is arranged below the TMR element 12 so as to induce a magnetic field parallel to the film surface of the TMR element 12 by a write current.

The first embodiment has exemplified the p-type semiconductor substrate 1 and the n-type diffusion regions 2 and 3. However, the substrate and diffusion regions may be of opposite conductivity types.

Figure 5:
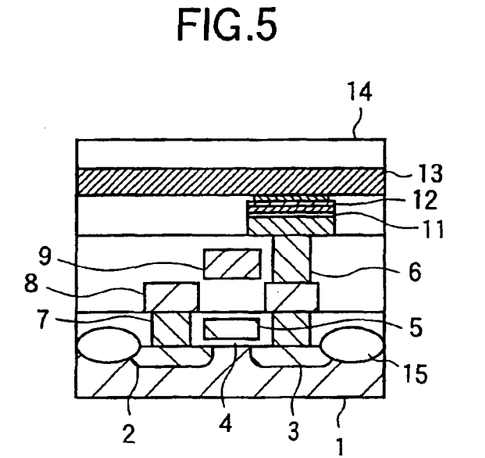
FIG. 5 is a schematic sectional view showing a perpendicular magnetization memory cell as another cell structure of the memory element in the present invention.

FIG. 5 is a schematic sectional view showing a perpendicular magnetization memory cell as another cell structure of the memory element in the present invention.

As shown in FIG. 5, in the perpendicular magnetization memory cell, the write line 9 is arranged beside the TMR element 12 so as to induce a magnetic field almost perpendicular to the film surface of the TMR element 12 by a write current.

Read operation of the ferromagnetic memory will be described by exemplifying a 3×3-bit ferromagnetic memory shown in FIG. 1. In this case, the memory element is one shown in FIG. 5, and an operation of successively reading out pieces of information from the TMR elements R11, R12, and R13 shown in FIG. 1 will be explained.

First, the field effect type transistor Ts1 is turned on to select the bit line BL1. The field effect type transistor T11 is turned on by the memory cell selection line SL1 to apply a voltage (target voltage Vt) corresponding to the bias voltage Vb across the TMR element R11. The voltage of the bit line BL1 is indefinite before the field effect type transistor Ts1 is turned on. A predetermined time is taken to, e.g., charge the bit line BL1 until the voltage reaches the target voltage Vt.

Then, a signal current flowing through the TMR element R11 is transferred to the read circuit 90 via the field effect type transistor Ts1. The signal current is converted into a voltage by the load resistor Rr, and the voltage is input to one input terminal of the sense amplifier SA. The sense amplifier SA compares the voltage input to one input terminal with the reference voltage Vref of the other input terminal, and outputs information "0" or "1".

After that, the field effect type transistor T11 is turned off, and the field effect type transistor T12 is turned on. At this time, the field effect type transistor Ts1 is kept on, and the bit line BL1 is kept selected.

One of the TMR elements R11, R12, and R13 connected to the bit line BL1 is kept selected, and the voltage of the bit line BL1 is maintained at the target voltage Vt without greatly changing the load of the bit line BL1. Thus, the time required to set the voltage of the bit line BL1 to the target voltage Vt can be eliminated in turning on the field effect type transistor T12 and selecting the TMR element R12. Immediately when the field effect type transistor T12 is turned on, a signal current flowing through the TMR element R12 can be transferred to the read circuit 90 via the field effect type transistor Ts1.

Then, the field effect type transistor T12 is turned off, and the field effect type transistor T13 is turned on. Also in this case, the voltage of the bit line BL1 is maintained at the target voltage Vt. A signal current flowing through the TMR elementR13 can be immediately transferred to the read circuit 90 via the field effect type transistor Ts1.

According to the ferromagnetic memory read method of the first embodiment, TMR elements are successively selected to always select one of TMR elements connected to the same bit line, and information in the TMR element is read out. The time required to set the voltage of the bit line is not required every selection of a TMR element, and high-speed read operation can be realized.

As described above, the ferromagnetic memory of the first embodiment can realize, by a simple structure and driving method, an object which cannot have been achieved by a conventional memory.

In the first embodiment, the field effect type transistor is employed as a switching element. However, the switching element may be a bipolar transistor, a thin film transistor, a diode, or a combination of them.

The ferromagnetic memory of this embodiment will be explained in more detail.

Figure 6:
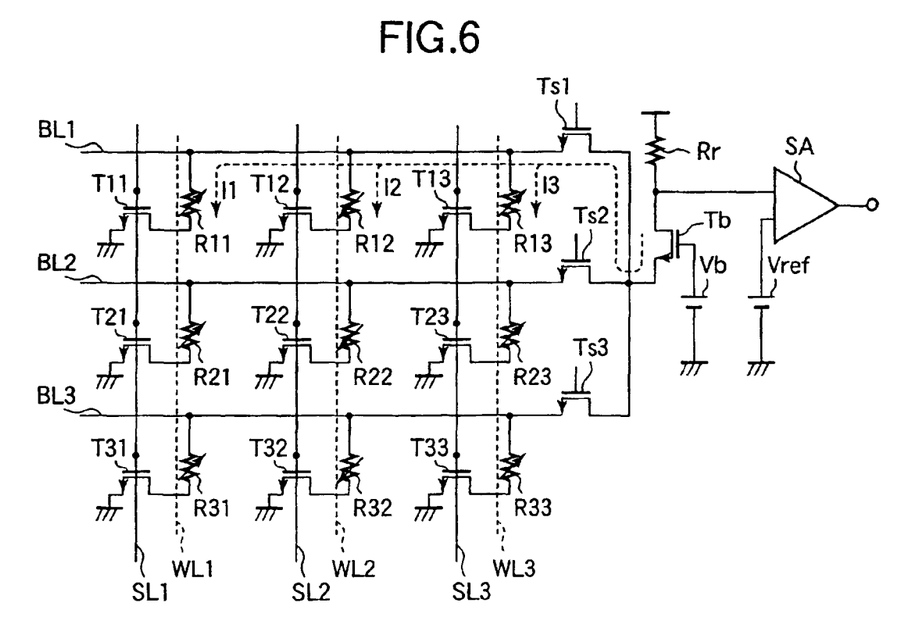
FIG. 6 is a circuit diagram showing a magnetic memory according to the present invention in which information is written in each memory cell.

FIG. 6 is a circuit diagram showing a magnetic memory according to the present invention in which information is written in each memory cell.

The magnetic memory has the same arrangement as that in FIG. 1.

The same reference numerals denote the same parts, and a description thereof will be omitted.

An operation of successively reading out pieces of information from the TMR elements R11, R12, and R13 will be explained. In the first embodiment, pieces of information "1", "0", and "1" are written in the TMR elements R11, R12, and R13. The memory cell selection lines SL1, SL2, and SL3 operate such that one of them is always sequentially selected.

Information written in the TMR element can be appropriately determined, and is not limited to the embodiment. The selection order of the memory cell selection line can be properly set, and is not limited to the embodiment.

First, the field effect type transistor Ts1 is turned on to select the bit line BL1. The memory cell selection line SL1 is turned on to apply a voltage (target voltage Vt) corresponding to the bias voltage Vb across the TMR element R11. At this time, a signal current I1 flows through the read circuit 90.

Then, the field effect type transistor T11 is turned off, and the field effect type transistor T12 is turned on. At this time, a signal current I2 flows through the read circuit 90.

Finally, the field effect type transistor T12 is turned off, and the field effect type transistor T13 is turned on. At this time, a signal current I3 flows through the read circuit 90.

Since "1", "0", and "1" are respectively written in the TMR elements R11, R12, and R13, the current values of the signal currents I1, I2, and I3 satisfy I1=I3<I2.

Figure 7:
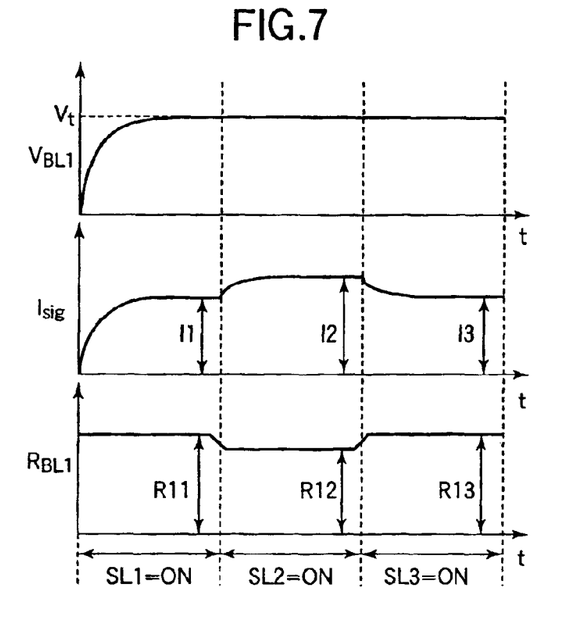
FIG. 7 is a timing chart showing read operation according to the first embodiment.

FIG. 7 is a timing chart showing read operation according to the first embodiment.

FIG. 7 shows changes in a voltage $V_{BL1}$ of the bit line BL1, the signal current Isig, a load $R_{BL1}$ viewed from the bit line in the above-described read operation.

The operation of this embodiment will be further explained with reference to FIG. 7.

The first embodiment is characterized in that at least one of memory cells on the same bit line is always selected during read operation of successively reading out pieces of information from memory cells connected to the same bit line. The variation amount of the load of the bit line is determined by only a change in resistance value caused by the MR ratio of the TMR element. Thus, the voltage of the bit line is kept almost constant. As is apparent from FIG. 7, this operation does not require any period for charging the bit line, and a current as a result of reading out information is output at high speed.

Note that an always selected memory cell may always be the same memory cell. In this case, this memory cell is defined as a dummy cell in which no magnetic information is written. In the use of the dummy cell, a plurality of memory cells aligned on the same column are preferably set as dummy cells. This facilitates driving because only one memory cell selection line for turning on a dummy cell suffices to be selected.

As described above, the present invention provides a magnetic memory for suppressing variations in the voltage level of a bit line or suppressing variations in burden including a variable resistor connected to a bit line before the start of read operation or during read operation when a plurality of variable resistors on the same bit line are sequentially, successively selected to read out signals from the variable resistors.

The step of suppressing variations in voltage level adopts a driving method of sequentially, successively selecting a plurality of variable resistors on the same bit line during read operation so as to always select any one of the variable resistors. As far as at least one of variable resistors on the same bit line is always selected, the burden of the bit line is determined by the resistance value of the variable resistor, and variations in voltage level can be suppressed.

By using the magnetic memory driving method of the present invention, variations in the voltage level of the bit line are suppressed, and the voltage level of the bit line during read operation is maintained at the target voltage Vt. A magnetic memory in which the time taken to charge the bit line to the target voltage Vt is shortened to enable reading out information at high speed can be provided.

Second Embodiment

The second embodiment of the present invention will be described.

Figure 8:
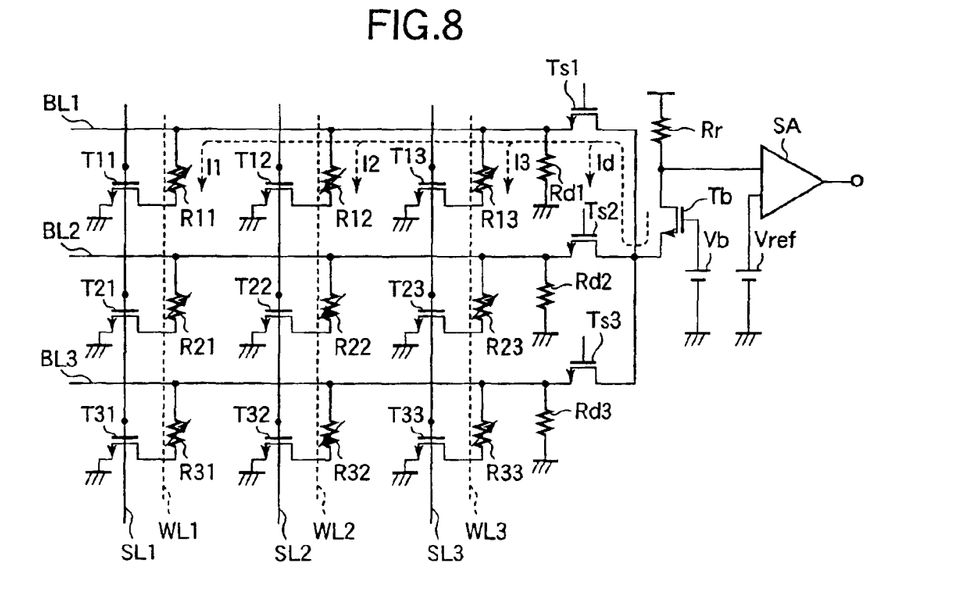
FIG. 8 is a circuit diagram showing the circuit arrangement of a ferromagnetic memory according to the second embodiment of the present invention.

FIG. 8 is a circuit diagram showing the circuit arrangement of a ferromagnetic memory according to the second embodiment of the present invention which showing at least one load element arranged on the bit line independently of memory elements.

For example, in FIG. 8, load elements Rd1, Rd2, and Rd3 are different from memory cells elements.

The same reference numerals denote the same parts, and a description thereof will be omitted.

The second embodiment of the present invention is characterized in that a dummy load serving as a load element for suppressing variations in burden before the start of read or during read operation is connected to a bit line as a means for suppressing variations in burden. The load of a selected bit line is either a synthetic load of a dummy load and variable resistor or a single dummy load, and thus variations in burden can be suppressed.

By using a dummy load and successively reading out pieces of information from TMR elements connected to the same bit line, variations in the burden of the bit line are suppressed, and the voltage level of the bit line during read operation is maintained at the target voltage Vt. The time required to charge the bit line up to the target voltage Vt is shortened.

Note that the second embodiment assumes a resistor as a dummy load. Instead, the dummy load may be a resistor having the same structure as that of the variable resistor, a resistor having a structure different from that of the variable resistor, a current source, a diode, or a combination of them.

In the second embodiment, memory cell selection lines SL1, SL2, and SL3 are successively selected at a predetermined interval. The second embodiment is different from the first embodiment in that no memory cell selection line is turned on during read from each memory cell.

More specifically, a field effect type transistor Ts1 is turned on to select a bit line BL1. A field effect type transistor T11 is turned on to apply a voltage (target voltage Vt) corresponding to the bias voltage Vb across a TMR element R11. A signal current flowing through a read circuit 90 at this time is a synthetic current of a signal current flowing through the TMR element R11 and a signal current Id flowing through the dummy load Rd1.

Then, the field effect type transistor T11 is turned off. A signal current flowing through the read circuit 90 at this time is only the signal current Id flowing through the dummy load Rd1.

In this manner, a signal current when the field effect type transistor T11, T12, or T13 is ON is a synthetic current of the signal current I4, I5, or I6 flowing through the corresponding TMR element R11, R12, or R13 and the signal current Id flowing through the dummy load Rd1. A signal current when no field effect type transistor T11, T12, or T13 is ON is only the signal current Id flowing through the dummy load Rd1.

Figure 9:
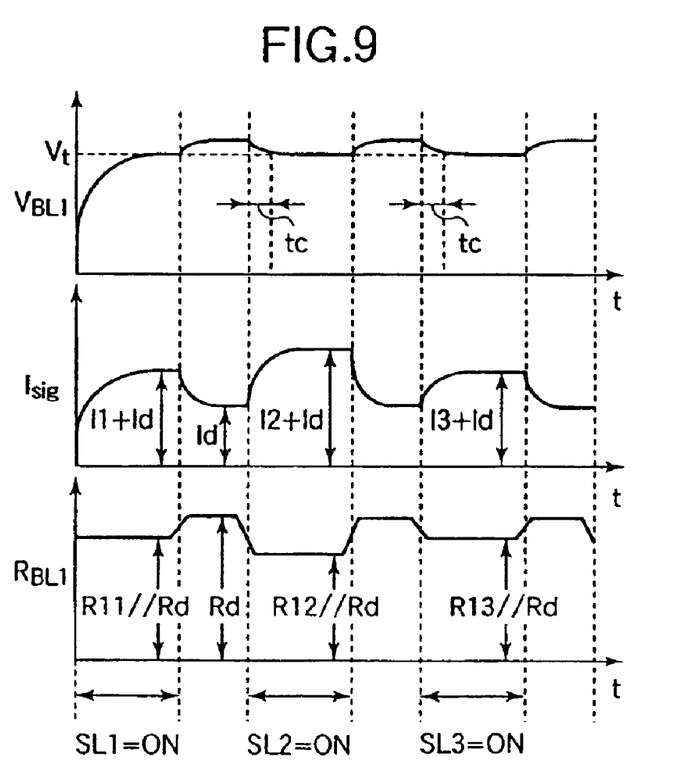
FIG. 9 is a timing chart showing an operation according to the second embodiment of the present invention.

FIG. 9 is a timing chart showing an operation according to the second embodiment of the present invention.

FIG. 9 shows changes in the voltage $V_{BL1}$ of the bit line BL1, the signal current Isig, the load $R_{BL1}$ viewed from the bit line in the above-described read operation.

A more detailed operation will be explained with reference to FIG. 9. Since the dummy load Rd1 is connected to the bit line, variations in the load of the bit line BL1 are suppressed by the dummy load Rd1 even if no memory cell is selected in read operation of successively reading out pieces of information from memory cells connected to the same bit line. As is apparent from FIG. 9, the voltage of the bit line BL1 is kept almost constant, and a time (charge time) tc required to charge the bit line is shortened. Accordingly, a current as a result of reading out information is output at high speed.

Note that the first and second embodiments of the present invention can be more effectively combined.

As has been described above, the load element suppresses variations in the load of the bit line, and the time taken to set the voltage of the bit line every selection of the variable resistor can be shortened, realizing high-speed read operation.

What is claimed is:

1. A method of driving a memory which has a plurality of variable resistors arrayed in a matrix, a plurality of switches connected to the plurality of variable resistors, and a plurality of bit lines arranged on respective rows of the matrix, one terminal of each variable resistor being connected to a corresponding bit line, and the other terminal being connected to a corresponding switch, comprising:

reading information of the bit lines; and while reading information from a plurality of variable resistors connected to a selected one of the bit lines, turning on the switch connected to at least one of the plurality of variable resistors connected to the selected bit line.

2. A method according to claim 1, further comprising the step of simultaneously with turning off one of the switches, turning on the switch corresponding to the variable resistor to be read next.

* * * * *

UNITED STATES PATENT AND TRADEMARK OFFICE
CERTIFICATE OF CORRECTION

PATENT NO.     : 6,930,912 B2
DATED          : August 16, 2005
INVENTOR(S)    : Fumihiro Inui It is certified that error appears in the above-identified patent and that said Letters Patent is hereby corrected as shown below:

Column 1,
Line 63, "referred to" should read -- referred to as --.

Column 3,
Line 29, "which each of is" should be deleted.

Column 9,
Line 38, "elementR13" should read -- element R13 --.

Column 10,
Line 18, "signal current 12" should read -- signal current I2 --;
Line 21, "signal current 13" should read -- signal current I3 --;
Line 24, "signal currents 11, 12, and 13" should read -- signal currents I1, I2, and I3 --.

Column 12,
Line 3, "signal current 14, 15, or 16" should read -- signal current I4, I5, or I6 --.

Signed and Sealed this

Seventh Day of February, 2006

JON W. DUDAS
*Director of the United States Patent and Trademark Office*